United States Patent [19]

Gokhale et al.

[11] Patent Number: 5,404,102
[45] Date of Patent: Apr. 4, 1995

[54] METHOD AND APPARATUS FOR ELECTRICALLY EXCITING A MAGNETO-RESISTOR DEVICE

[75] Inventors: Kalyan P. Gokhale, Shelby Township, Macomb County; Thaddeus Schroeder, Rochester Hills, both of Mich.

[73] Assignee: General Motors Corporation, Detroit, Mich.

[21] Appl. No.: 2,370

[22] Filed: Jan. 6, 1993

[51] Int. Cl.$^6$ ............................................. G01R 33/06
[52] U.S. Cl. .................................. 324/252; 324/235; 323/294
[58] Field of Search ...................... 324/207.20, 207.21, 324/252, 235; 307/309; 323/294; 338/32 R, 32 H

[56] References Cited

U.S. PATENT DOCUMENTS

| | | | |
|---|---|---|---|
| 3,172,032 | 3/1965 | Hunt | 324/252 X |
| 3,340,463 | 9/1967 | Oka | 324/251 X |
| 3,564,395 | 2/1971 | Hieronymus et al. | 324/252 X |
| 4,464,625 | 8/1984 | Lienhard et al. | 324/252 X |
| 4,727,323 | 2/1988 | Zabler | 324/252 |
| 4,835,467 | 5/1989 | Gokhale | 324/166 |
| 4,868,909 | 9/1989 | Löwel | 324/225 |
| 4,922,126 | 5/1990 | Löwel | 307/261 |
| 4,926,122 | 5/1990 | Schroeder et al. | 324/207.13 |
| 4,926,154 | 5/1990 | Heremans et al. | 338/32 R |
| 4,939,456 | 7/1990 | Morelli et al. | 324/207 |
| 4,978,938 | 12/1990 | Partin et al. | 338/32 R |
| 5,038,130 | 9/1991 | Eck et al. | 338/32 R |

*Primary Examiner*—Sandra L. O'Shea
*Assistant Examiner*—Warren S. Edmonds
*Attorney, Agent, or Firm*—Timothy G. Gorbatoff

[57] ABSTRACT

A method and apparatus for electrically exciting a magneto-resistor (MR) device that is adapted to sense variations in a magnetic field. Electric current is delivered to flow through the MR device and produce a voltage drop across the resistance the MR device, where the voltage drop varies in accordance with changes in the flux density of the sensed magnetic field. The current flowing through the MR device is limited to a predetermined maximum current value to prevent damage to the MR device due to self heating at elevated operating temperatures. When the delivered current is less than the predetermined maximum current value, the current flowing through the MR device is controlled to maintain a measured characteristic of the voltage drop appearing across the MR device at a desired value. This increases the sensitivity of the MR device over its operating temperature range to variations in the sensed magnetic field. In one embodiment, the delivered current is controlled to maintain the peak voltage appearing across the resistance of the MR device at a desired peak value. In another embodiment, the delivered current is controlled to maintain the average voltage appearing across the MR device at a desired average value.

6 Claims, 6 Drawing Sheets

METHOD AND APPARATUS FOR ELECTRICALLY EXCITING A MAGNETO-RESISTOR DEVICE

BACKGROUND FOR THE INVENTION

This invention relates generally to magneto-resistor devices employed in position and speed sensors, and more particularly, to a method and apparatus for electrically exciting a magneto-resistor sensing device to achieve increased sensitivity over a broad range of operating temperatures, while preventing damage due to self heating at elevated operating temperatures.

It is well recognized that magneto-resistor (MR) devices can be employed in sensors for measuring the position and/or speed of moving ferromagnetic objects (see for example, U.S. Pat. Nos. 4,835,467, 4,926,122, and 4,939,456, which are assigned to the assignee of the present invention). In such applications, an MR device is typically biased with a magnetic field and then electrically excited using some form of constant current or constant voltage source. As a ferromagnetic object, such as a toothed wheel or rack, is moved proximate and relative to the MR device, the flux density of the magnetic field passing through the MR device is modulated, which in turn varies the resistance of the MR device. The position and/or speed of movement of the ferromagnetic object is then generally determined by processing or conditioning the resulting modulation in the voltage drop that appears across the MR device.

Conventionally, problems are encountered when the above type of MR sensors are required to function over a broad range of operating temperatures. The resistance of an MR device exhibits a significant negative temperature coefficient, i.e., the resistance decreases with increasing operating temperature. As a result, when a constant current source is used to excite the MR device, the amplitude of the quiescent voltage drop produced across the MR device decreases with increasing temperature, which reduces the sensitivity of the MR sensor. Conversely, when a constant voltage source is used to excite one or more MR devices in a bridge configuration, such as described in U.S. Pat. No. 5,038,130 issued to Eck et al., the quiescent voltage drop appearing across any MR device must be set sufficiently low to prevent destruction due to self heating at higher operating temperatures as the MR resistance decreases.

Consequently, there exists a need for a method and apparatus for optimizing the electrical excitation of a magneto-resistor device that is adapted to sense variations in a magnetic field over a wide range of operating temperatures.

SUMMARY OF THE INVENTION

The present invention is directed toward providing an improved method and apparatus for electrically exciting a magneto-resistive device that is adapted to sense variations in a magnetic field, whereby the magneto-resistor device can be operated over a wide range of temperatures with increased sensitivity and is protected from damage due to self heating at elevated operating temperatures.

These and other objectives of the present invention are accomplished by delivering an electric current to flow through the magneto-resistor device so as to produce a voltage drop across the resistance of the magneto-resistor device that varies in accordance with changes in the flux density of a sensed magnetic field. The current delivered to the magneto-resistor device is limited to a predetermined maximum current value, thereby preventing damage to the magneto-resistor device due to self heating at elevated operating temperatures. When the delivered current is less than the predetermined maximum value, the delivered current is controlled to maintain a detected characteristic of the voltage drop across the magneto-resistor at a desired value. By maintaining the detected characteristic of the magneto-resistor voltage drop at the desired value, the sensitivity of the MR device to variations in the sensed magnetic field is increased over the operating temperature range. In addition, the effect of operating temperature variation on the sensitivity of the MR device is substantially reduced.

In one embodiment, the delivered current is controlled to maintain a detected peak voltage appearing across the resistance of the magneto-resistor device at a desired peak value. In another embodiment the delivered current is controlled to maintain a detected average voltage appearing across the magneto-resistor device at a desired average value.

These and other aspects and advantages of the invention may be best understood by reference to the following detailed description of the preferred embodiments when considered in conjunction with the accompanying drawings.

DESCRIPTION OF THE PREFERRED EMBODIMENTS

In the description that follows, similar parts or structures used in the figures will be designated with like numerals, and where such parts and structures have been previously discussed with respect to an earlier figure, the description will not be repeated.

Figure 1:
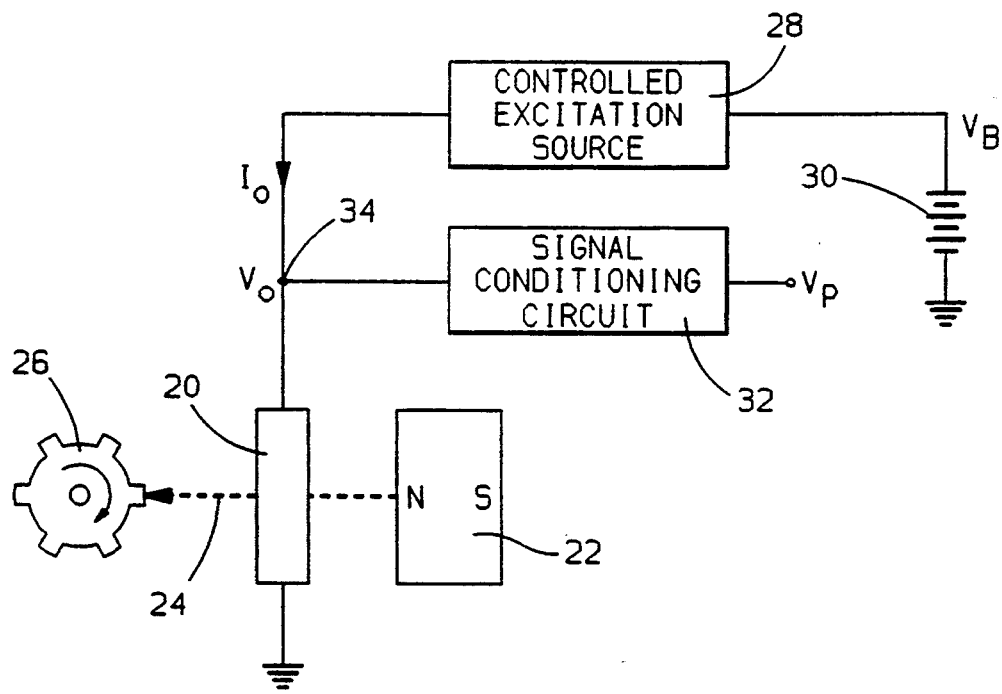
FIG. 1 illustrates schematically a wheel speed sensor employing a magneto-resistor device that is electrically excited with a controlled source that operates in accordance with the principles of the present invention.

Referring now to FIG. 1, there is shown schematically a magneto-resistive device 20, which is adapted to sense magnetic field variations in a wheel speed sensor application. The magneto-resistor (MR) device 20 is preferably fabricated from a material such as Indium Antimonide, or other suitable semiconductor magneto-resistive material, as for example, Indium Arsenide, in a manner such as described in U.S. Pat. Nos. 4,926,154 and 4,978,938, which are assigned to the same assignee as the present invention. A permanent magnet 22 is used to bias the MR device 20 such that magnetic flux represented by the dashed arrowed line 24 passes through the MR device 20.

Toothed wheel 26 is formed of a ferromagnetic material and is located proximate the MR device 20 as illustrated in FIG. 1. As wheel 26 rotates, the air gap between the MR device 20 and the wheel 26 is varied by the wheel teeth and spacings between the teeth. It is well recognized in the art, this variation in the air gap modulates the flux density of the magnetic field 24 passing through the magneto-resistor device 20. Since the resistance of MR device 20 is a function of the flux density of the magnetic field 24, the MR resistance is modulated in a sinusoidal fashion between a maximum value of $R_{MAX}$, when a tooth is adjacent the MR device 20, and a minimum value of $R_{MIN}$, when a space is adjacent the MR device 20. This behavior is represented graphically in FIG. 2, which shows the variation in the resistance of the MR device as a function of the angular rotation of wheel 26, with $R_{BIAS}$ representing the average or quiescent MR resistance value.

In accordance with the present invention, a controlled current source 28 is provided to deliver a current $I_O$, which flows through MR device 20 to develop a voltage drop across the MR device 20 with respect to ground potential, which is represented by the voltage potential $V_O$ appearing at junction 34. As indicated, a battery 30 of $V_B$ volts provides electrical energy to power the controlled current source 28.

Figure 2:
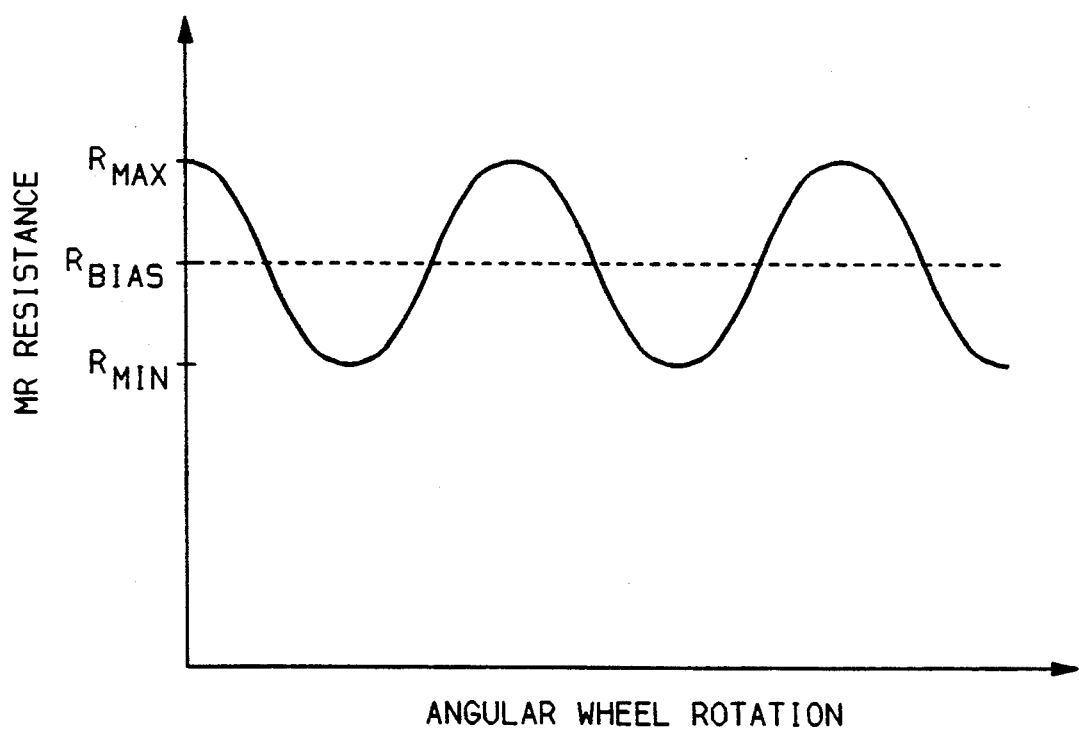
FIG. 2 illustrates the variation in the resistance of the magneto-resistor device as a function of angular wheel rotation in the wheel speed sensing application shown in FIG. 1.

It will be recognized that the voltage $V_O$ appearing at junction 34 also varies sinusoidally in accordance with the variation in the resistance of MR device 20 shown in FIG. 2, with a maximum value of $V_{OMAX}=I_O R_{MAX}$, and a minimum value $V_{OMIN}=I_O R_{MIN}$. As a result, there is a one to one correspondence between the maximum and minimum values in the voltage signal represented by $V_O$ and the passage of teeth and spaces between teeth, respectively, on wheel 26 by the MR device 20.

Although not considered part of the present invention, MR speed and/or position type sensors generally include a signal conditioning circuit 32 (shown coupled to junction 34 in FIG. 1) for processing or conditioning the voltage signal $V_O$ to produce a sensor output voltage designated here as $V_P$. Typically, the signal conditioning circuit 32 includes some form of voltage thresholding circuity for converting the sinusoidal waveform of $V_O$ into a pulsed waveform for $V_P$, see for example, U.S. Pat. No. 4,835,467 issued to Gokhale. It will also be recognized by those skilled in the art that the signal conditioning circuit 32 is customarily designed to have an input impedance much greater than that of the MR device 20 to avoiding any significant loading at junction 34.

Figure 3:
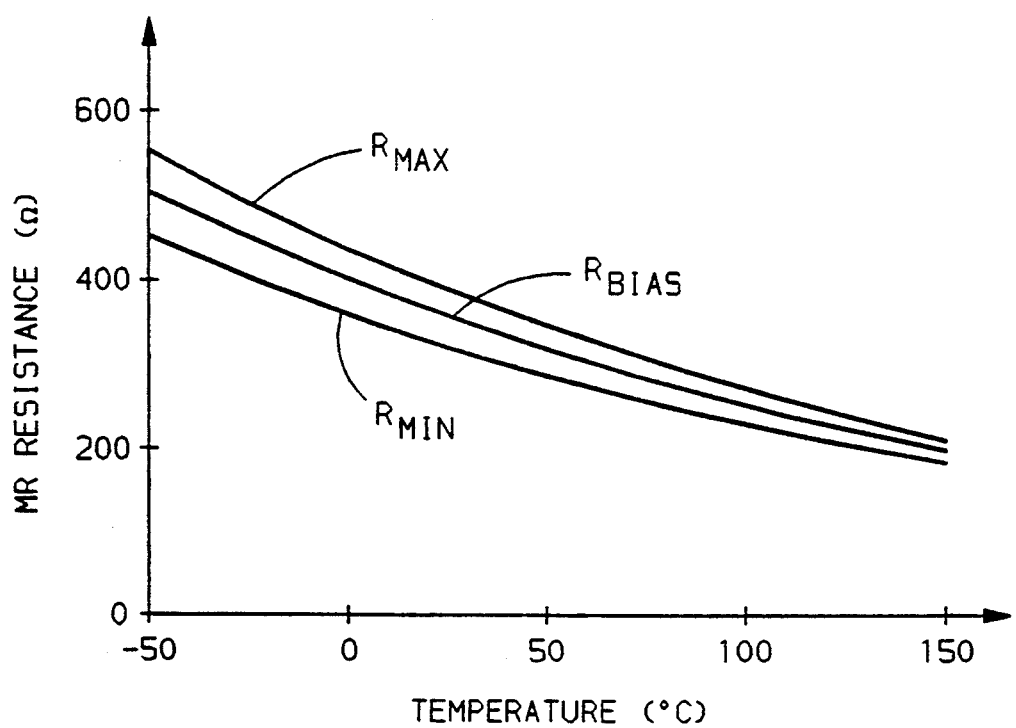
FIG. 3 illustrates graphically the variation in resistance of a typical magneto-resistor device with increasing operating temperature in an application such as that shown in FIG. 1.

As illustrated in FIG. 3, the resistance of MR device 20 decreases with increasing operating temperature. Likewise, the difference between the maximum and minimum resistances, $R_{MAX}$ and $R_{MIN}$ respectively, also diminishes with increasing temperature. As a result, it will be recognized that the sensitivity of the MR device 20 to changes in the magnetic flux 24, as measured by the peak-to-peak modulation of the voltage $V_O$ (i.e., $V_{OMAX}-V_{OMIN}$), will also decrease with increasing operating temperature when a constant current source is used to excite MR device 20. Likewise, if MR device 20 were to be excited with a constant voltage source in a bridge configuration such as that disclosed in U.S. Pat. No. 5,038,130 issued to Eck et al., the constant voltage of the source would have to be set at level low enough to ensure that the current flowing through the MR device 20 would cause damage due to self heating at elevated operating temperatures. However, when the voltage of the constant voltage source is selected in this fashion, the sensitivity of the MR device is significantly reduced at lower operating temperatures.

The present invention is directed toward providing a method and apparatus for optimizing the electrical excitation of a MR device employed for sensing variations in a magnetic field to attain increased MR sensitivity over a wide range of operating temperatures. Broadly, this is accomplished by delivering an electric current to flow through the MR device and produce a voltage drop across its resistance that varies in accordance with changes in the sensed magnetic field. The current delivered to flow through the MR device is limited to a predetermined maximum current value, thereby preventing damage to the magneto-resistor device due to self heating at elevated operating temperatures. When the delivered current is less than the predetermined maximum value, the current flowing through the MR device is controlled to maintain a detected predetermined characteristic of the voltage drop appearing across the MR device at a desired value. By maintaining this detected characteristic at the desired value, the sensitivity of the MR device to variations fin the sensed magnetic field is increased over the operating temperature range.

Figure 4:
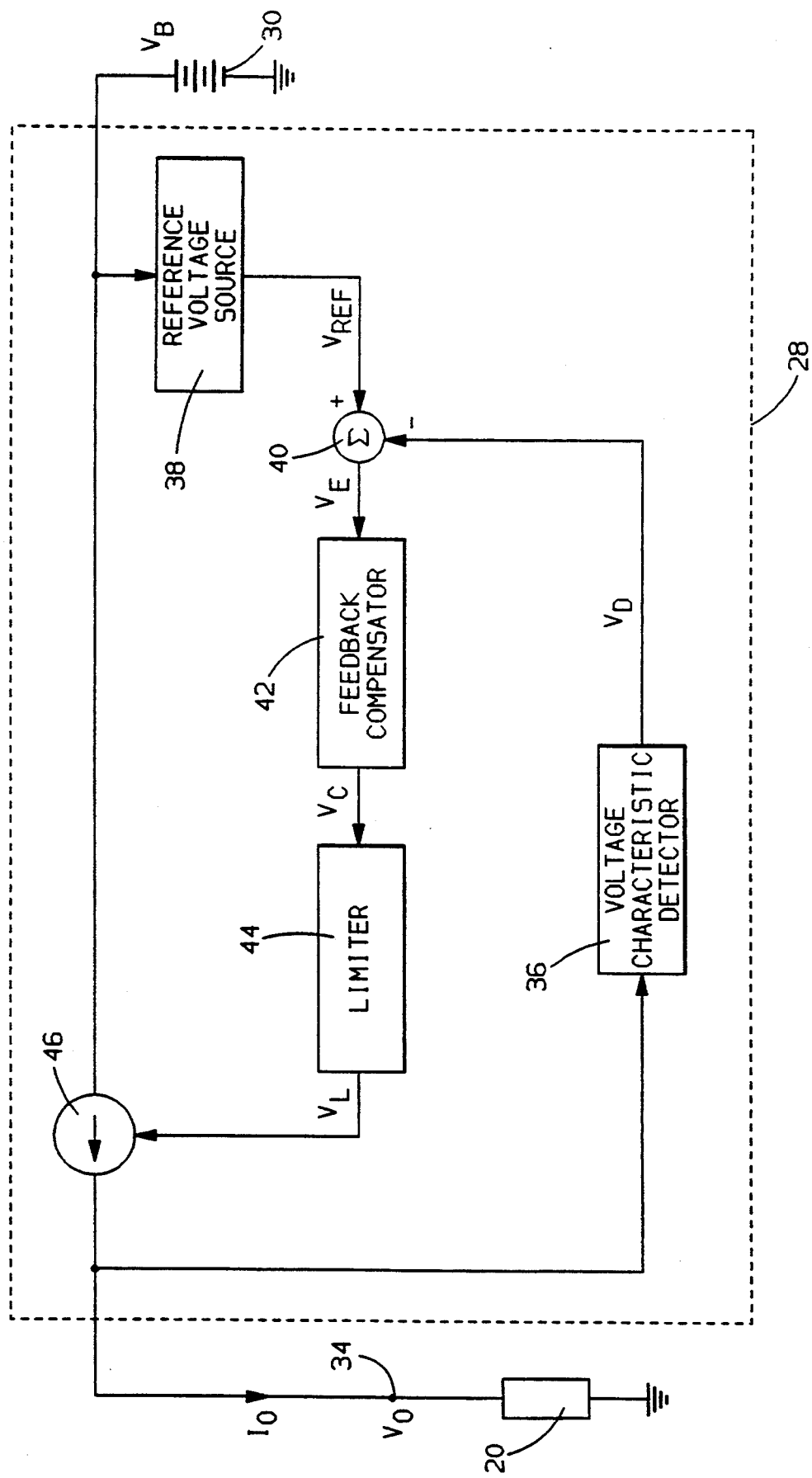
FIG. 4 illustrates functional model in block diagram form representing the operation of the controlled excitation source shown in FIG. 1.

Referring now to FIG. 4, there is shown a block diagram that represents the functional operation of the controlled excitation source 28 of FIG. 1, which regulates the current $I_O$ delivered to MR device 20 in accordance with the principles of the present invention. As indicated by the functional block diagram, the controlled excitation source 28 includes a voltage characteristic detector 36, a reference voltage source 38, a summer 40, a feedback compensator 42, a limiter 44, and a controlled current source 46, all connected in a feedback control configuration.

As will be described subsequently, the voltage characteristic detector 36 detects a predetermined characteristic of the voltage drop $V_O$ appearing across the MR device 20, for example, the peak voltage or the average voltage of $V_O$. This detected voltage characteristic, designated hereinafter as the voltage $V_D$, is then directed to the negative input of summer 40. A reference voltage designated as $V_{REF}$, and produced by reference voltage source 38, is directed to the positive input of summer 40. Reference voltage source 38 contains conventional circuitry well known in the art for deriving the constant reference voltage $V_{REF}$ based upon the voltage potential $V_B$ of the supply battery 30. The output from summer 40 is an error voltage $V_E$ that is equal in value to the difference between the reference voltage and the detected voltage characteristic (i.e., $V_E = V_{REF} - V_D$).

The feedback compensator 42 utilizes the error voltage $V_E$ to generate a control signal voltage $V_C$ in accordance with well known control techniques. This control voltage $V_C$ is input to the limiter 44, which in turn provides an output signal voltage $V_L$. The maximum voltage for $V_L$ is limited to the threshold voltage of the limiter 44; however, when $V_C$ is less than the limiter threshold voltage, the output signal $V_L$ is essentially equal to the input signal $V_C$.

The voltage signal $V_L$ produced by limiter 44 is applied to the controlled current source 23 to regulate the current $I_O$ delivered to flow through MR device 20 in a feedback control manner. The limiting value of the threshold voltage for limiter 44 is selected such that the current $I_O$ delivered to MR device 20 is limited to a predetermined maximum current value represented by $I_{OMAX}$. However, when the delivered current $I_O$ is less than $I_{OMAX}$, $I_O$ is controlled to maintain the detected voltage characteristic $V_D$ at the reference voltage $V_{REF}$ (i.e., the current $I_O$ is controlled to achieve a zero valued error voltage $V_E$, when $I_O < I_{OMAX}$).

Figure 5:
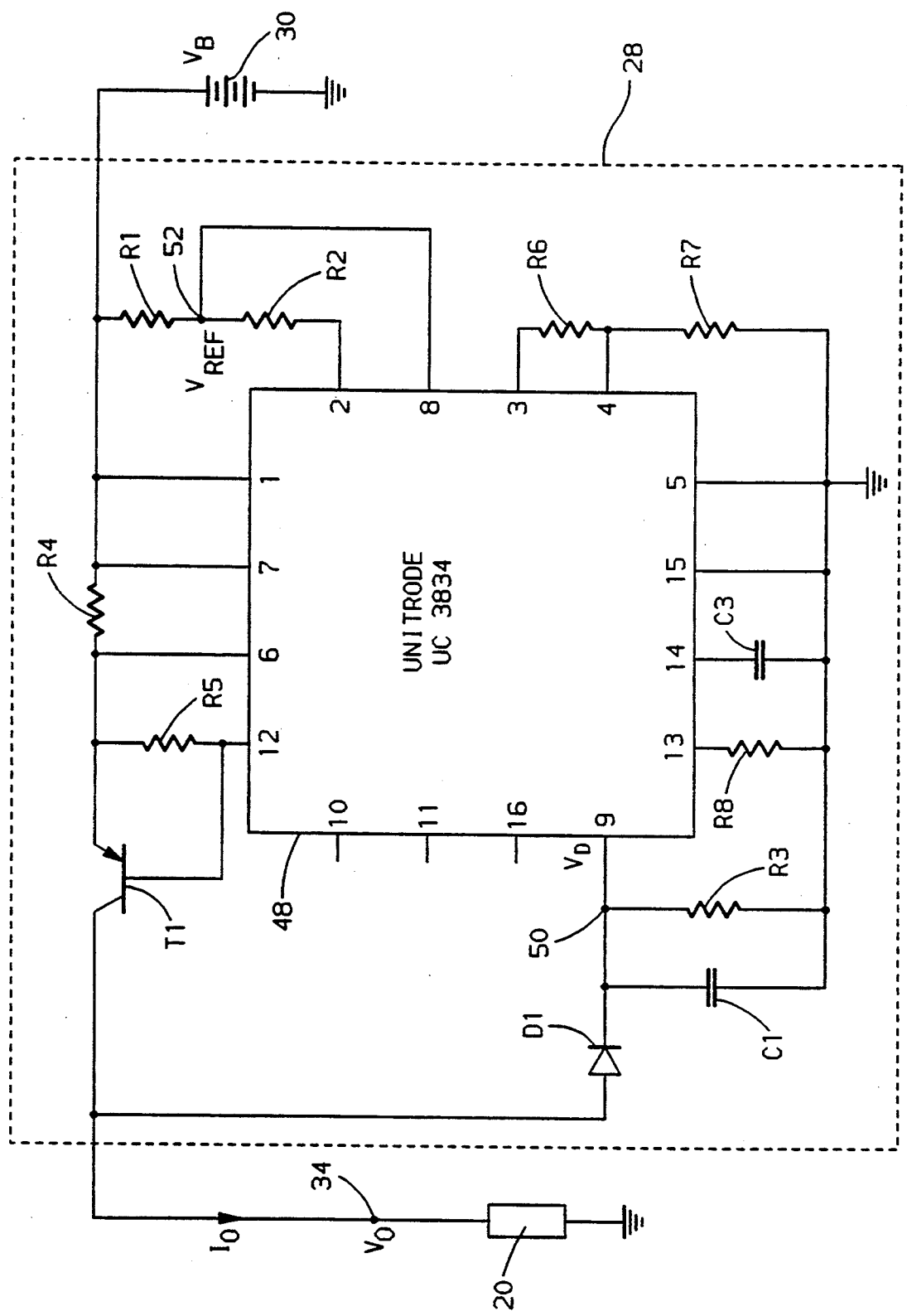
FIG. 5 illustrates circuitry for implementing a first embodiment for the controlled excitation source shown in FIG. 1, and functionally represented by the block diagram of FIG. 4, where the peak voltage appearing across the MR device is detected anti used for regulating the delivered current.

Referring now to FIG. 5, there is shown circuitry for implementing a first embodiment of the present invention. In this first embodiment, the peak voltage appearing across MR device 20 is the voltage characteristic that is detected and used in regulating the current delivered to flow through MR device 20. The principle component in this implementation is a linear regulator 48, such as a UC3834 integrated circuit, which is commercially available from Unitrode Integrated Circuits. The numerals ranging in value from 1 to 16 represent the actual pin numbers of the UC3834 integrated circuit package.

As will be recognized by those skilled in the art, diode D1, capacitor C1, and resistor R3 operate as a peak detector to detect the peak or maximum voltage characteristic (denote here as $V_D$ at junction 50) of the voltage drop $V_O$ appearing across the MR device 20. The detected peak voltage $V_D$ is applied to pin 9 of the linear regulator 48, which is the negative input to a summing amplifier within the UC3834 integrated circuit (see pages 3-81 to 3-84 of the 1987-88 Unitrode Linear Integrated Circuits Databook). In the present embodiment, values of 1 μF and 1 MΩ, respectively, for the capacitor C1 and resistor R3 have been found to adequately detect the peak value of the voltage $V_O$, while enabling the controlled excitation source 28 to correct for changes in peak voltage caused by variations in operating temperature.

Pins 1 and 5 of the UC3834 integrated circuit represent the plus and minus power supply inputs, respectively, which are connected to the voltage potential $V_B$ provided by battery 30, and circuit ground (designated by the conventional ground symbol). Pin 2 provides a −2.0 volt reference with respect to the positive supply voltage applied at pin 1, i.e., the voltage reference at pin 2 is $V_B - 2.0$. For the purpose of explicating the operation of the present invention, battery 30 will be presumed to supply a voltage potential of $V_B = 12.0$ volts, which in turn sets the voltage reference at pin 2 to 10.0 volts. Likewise, pin 3 of UC3834 provides a 1.5 volt voltage reference with respect to circuit ground potential.

Resistors R1 and R2 are connected in series at junction 52 with their other ends connected to battery 30 and pin 2. Typical values for R1 and R2 are 10 KΩ each, which for the present embodiment sets the reference voltage $V_{REF}$ at junction 52 to 11.0 volts. As indicated, this value for the reference voltage $V_{REF}$ is applied to pin 8, which is the positive input to the same internal summing amplifier that has pin 9 as its negative input. The output from this internal summing amplifier represents the error voltage $V_E$ obtained by subtracting the detected peak voltage $V_D$ from the reference voltage $V_{REF}$, as previously indicated in the block diagram of FIG. 4.

The error voltage $V_E$ is applied to control the operation of a current driver, which is also internal to UC3834. This current driver has pin 12 as the driver current sink, and pin 13 as the driver current source. In the present application, resistor R8 (typically 2 KΩ) provides the appropriate bias for the internal current driver by connecting the current driver source (pin 13) to ground potential. The sink of the internal current driver (pin 12) is connected to external resistor R5 and the base of transistor T1. Resistor R5, with a typical value of 2 KΩ, acts to bias transistor T1 and the internal current driver of UC3834. Error voltage $V_E$ is fed to the feedback compensator 42 internal to UC3834, which produces the signal $V_C$ at pin 14. The capacitor C3 at pin 14 with a value of 10 nF, along with the internal error amplifier act as a relatively fast integrating compensator. The voltage $V_C$ controls the amount of current entering the internal current driver sink at pin 12, which in turn controls the base current of transistor T1. This base current regulates the collector current of transistor T1, which is essentially the current $I_O$ delivered to the MR device 20.

Resistor R4 is used for sensing the magnitude of current flowing from the battery 30 through transistor T1 to the MR device 20. The voltage drop developed across resistor R4 (having a typical value of 2 Ω) is input to UC3834 via pins 6 and 7. Pins 6 and 7 are connected to a current sensing amplifier internal to UC3834, which has an adjustable current sensing threshold voltage set by the voltage applied to pin 4. If the voltage drop developed across resistor R4 equals or exceeds the established current sensing threshold voltage, the internal current sensing amplifier functions to control the internal current driver to limit further increases in the current flowing through transistor T1 to the MR device 20. This establishes the limiting current or maximum current value previously referred to as $I_{OMAX}$.

Design curves and equations for relating the magnitude of the voltage applied to pin 4 to the level of the threshold voltage, and hence the maximum or limiting current value $I_{OMAX}$ are given at pages 3-83 and 3-84 of the Unitrode 1987-88 Linear Integrated Circuits Databook. The magnitude of the voltage applied to pin 4 is determined by the resistance values of resistors R6 and R7 forming a voltage divider between the 1.5 volt reference at pin 3 and circuit ground. For the present application, resistors R6 and R7 each have a value of 10K Ω, which sets the voltage at pin 4 to approximately 0.75 volts. This in turn sets the threshold voltage for the internal current sensing amplifier to a value of approximately 0.072 volts, which corresponds to setting $I_{OMAX}=36.0$ mA (recall that the sensing resistor R4 has a resistance of 2 $\Omega$).

In operation, the controlled excitation source 28, as embodied in FIG. 5, detects the peak voltage $V_D$ appearing across the MR device 20, and then functions to maintain $V_D$ at the peak reference voltage $V_{REF}$ determined by the values of resistors R1 and R2, as long as the current $I_O$ delivered to MR device 20 does not exceed the maximum current value $I_{OMAX}$ determined by the values of resistors R6 and R7. For the present embodiment, $V_{REF}$ is set at 11.0 volts to provide for a voltage drop of at least a 1.0 volt across the controlled excitation source 28 (appearing between battery 30 and MR device 20). This was necessary to ensure the proper operation of the controlled excitation source 28. The applicants have found that the maximum permissible value for the current limit $I_{OMAX}$ is equal to the square root of the quantity $(P_D/R_{MAX})$ determined at the highest expected operating temperature of the MR device 20, where $P_D$ represents the maximum power that can be safely dissipated in MR device 20 (typically provided its manufacturer), and $R_{MAX}$ is the largest resistance of MR device 20 in its sensing application (see FIGS. 2 and 3).

Figure 7:
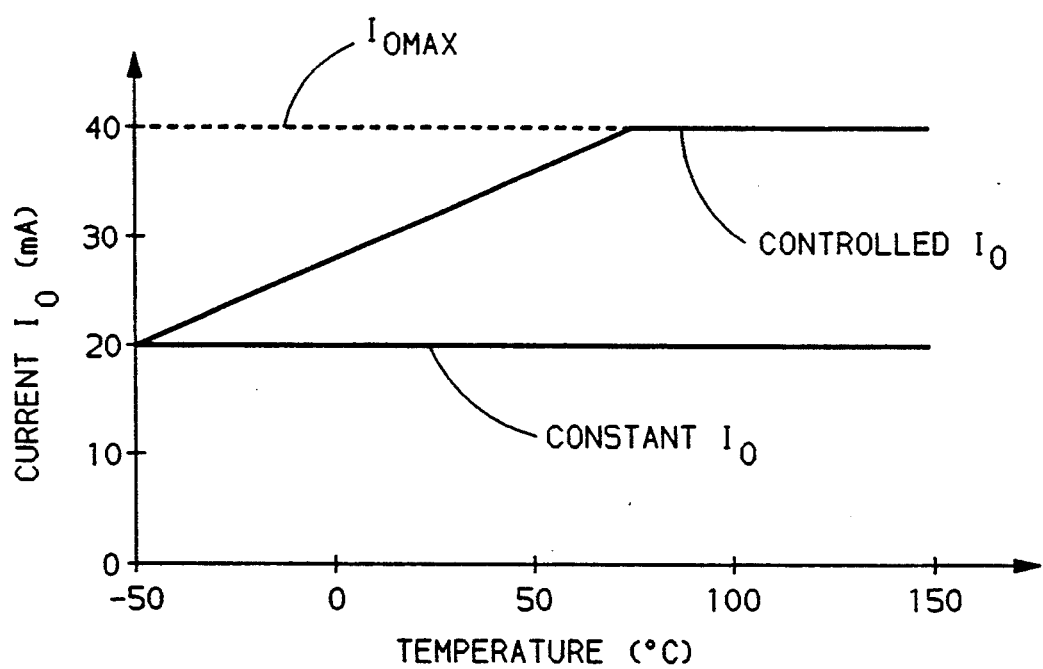
FIG. 7 illustrates graphically a comparison of the current delivered to the MR device when using a constant current source and the excitation source controlled in accordance with the present invention.

FIG. 7 graphically illustrates curves representing the current $I_O$ delivered to MR device 20 over the expected temperature operating range for the MR device 20, which is assumed to extend from $-50°$ to $150°$ C. for the purpose of explaining the operation of the present invention. The curve labeled CONSTANT $I_O$ represents the current delivered to flow through MR device 20 when using a constant 20 mA current excitation source. The curve labeled CONTROLLED $I_O$ represents the delivered current when using the controlled excitation source 28 operating in accordance with the principles of the present invention. It will be recognized that the current $I_O$ delivered to MR device 20 is limited to a maximum value of $I_{OMAX}$ when using the controlled excitation source 28.

Figure 8:
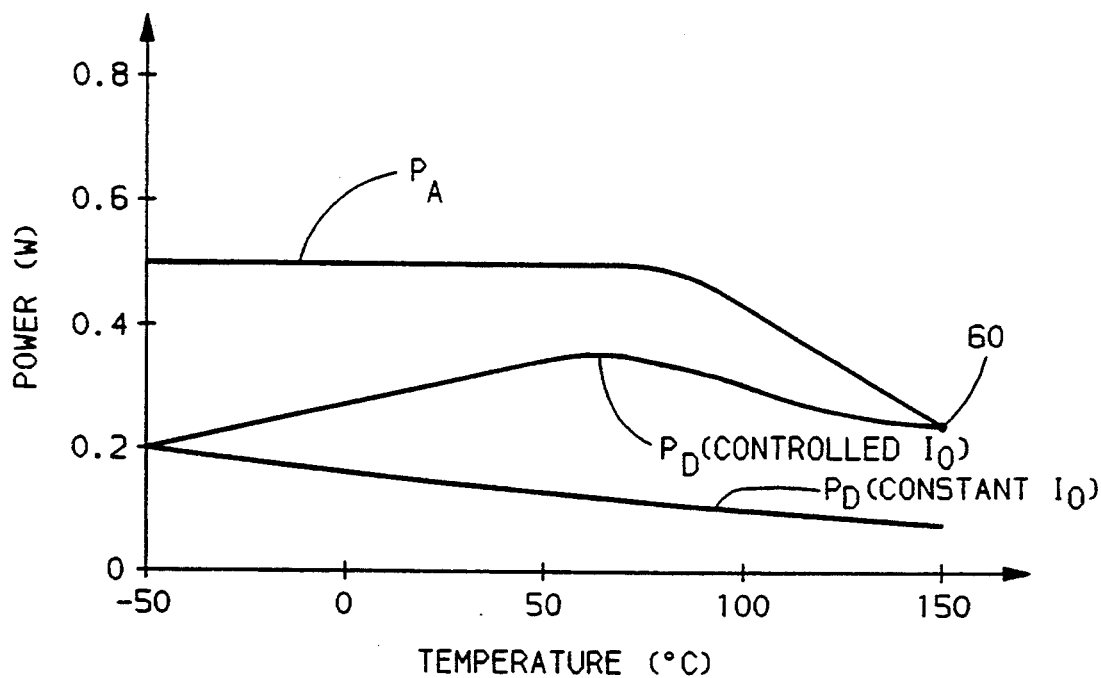
FIG. 8 illustrates graphically the maximum allowable power dissipation versus operating temperature for a MR device compared with the actual power dissipated in the MR device when using a constant current source and the excitation source controlled in accordance with the present invention.

Turning now to FIG. 8, there is shown curves representing the allowed maximum and actual power dissipation in MR device 20 over its expected temperature operating range. The curve labeled $P_A$ represents the maximum allowable power dissipation for MR device 20. The curve labeled $P_D$(CONSTANT $I_O$) represents the actual power that would be dissipated in the MR device 20 when excited with a constant 20 mA current source, while the curve labeled $P_D$(CONTROLLED $I_O$) represents the actual power dissipated in MR device 20 when the present invention is used for excitation. It will be recognized that for a given operating temperature, the actual power dissipated in MR device 20 never exceeds the maximum allowable power dissipation; however, the curve labeled $P_D$(CONTROLLED $I_O$) intersect the curve labeled $P_D$ at the point 60 when the operating temperature is $150°$ C. This occurs because the highest expected operating temperature for the MR device 20 in the presently described application has been assumed to be $150°$ C., and the value for the maximum current $I_{OMAX}$ (36 mA) is then determined based upon the values of $P_D$ at $150°$ C. (approximately 0.25 W, see point 60 in FIG. 8) and $R_{MAX}$ at $150°$ C. (approximately 190 $\Omega$, see FIG. 3). By determining $I_{OMAX}$ based upon these values, the present invention assures that the MR device will not be damaged due to self heating over its range of expected operating temperatures.

Figure 9:
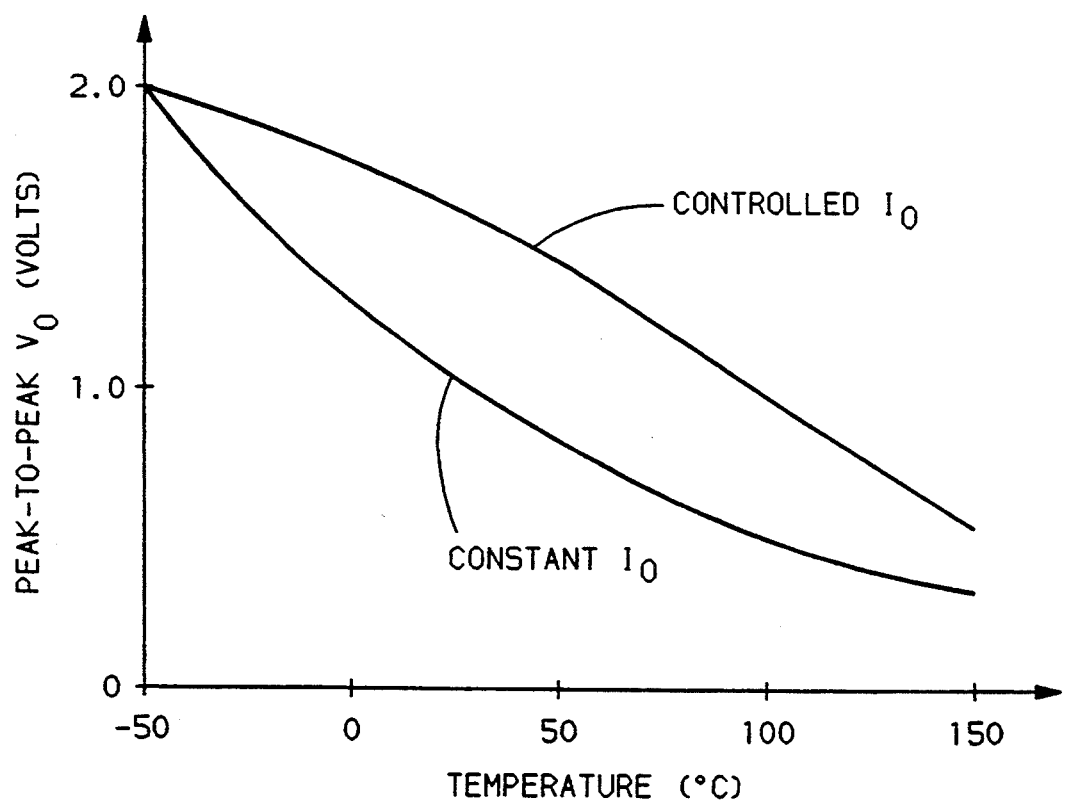
FIG. 9 illustrates graphically the sensitivity of the MR device over the operating temperature range as measured by the peak-to-peak variation in voltage appearing across the MR device for a constant current source and the excitation source controlled in accordance with the present invention.

Referring now to FIG. 9, there is shown a comparison of the sensitivity of MR device 20 over its assumed operating temperature range when excited by a constant 20 mA current source (the curve labeled CONSTANT $I_O$), and when excited by as source operating in accordance with the present invention (the curve labeled CONTROLLED $I_O$). The sensitivity of the MR device 20 is measured by the peak-to-peak variation in the voltage drop $V_O$ appearing at junction 34, which is equal to $I_O(R_{MAX}-R_{MIN})$. For both types of excitation, the sensitivity of the MR device 20 decreases with increasing operating temperature due to the negative temperature coefficient for the resistance of MR device 20. However, at elevated operating temperatures, the sensitivity of the MR device 20 when excited by the present invention is approximately twice that when excited by a conventional constant current source that supplies identical current at the lowest expected operating temperature (i.e., $-50°$ C.). Thus, the present invention prevents the MR device 20 from being damaged due to self heating and also significantly improves its sensitivity to magnetic field variations.

It will also be recognized by comparing the slopes of the curves presented in FIG. 9, that the present invention provides an additional advantage in that the effect of temperature variations on the sensitivity of the MR device 20 is significantly reduced, which conventionally has required the addition of temperature sensors and other expensive circuitry in the prior art.

Rather than detecting the peak voltage characteristic of the voltage drop $V_O$ across the MR device as in the first embodiment, the applicants have found that the same advantages can be achieved by detecting the average voltage characteristic of the voltage $V_O$. One way possible way to implement this second embodiment of the invention would be to use a well known Low pass filter as the voltage characteristic detector 36 in the block diagram of FIG. 4. The voltage $V_D$ would then represent the detected DC or average value of the voltage drop $V_O$ appearing across MR device 20, and the voltage $V_{REF}$ would represent the desired average voltage value to which $V_D$ would be maintained by the controlled excitation source 28.

In terms of the implementation presented in FIG. 5, the second embodiment for the invention can be realized by simply replacing the peak detector consisting of diode D1, capacitor C1, and resistor R3, with any known form of lowpass filter (for example, a simple resistor-capacitor lowpass filter). However, the applicants have found a simpler way for implementing the second embodiment of the invention, which is presented in FIG. 6. Instead of lowpass filtering the voltage signal $V_O$ before it enters pin 9 of the UC3834 integrated circuit, the signal $V_O$ is applied directly to pin 9 (in which case, $V_D=V_O$). Recall that pins 8 and 9 of the UC3834 integrated circuit are respectively connected to the positive and negative inputs of its internal summing amplifier. For this embodiment, a relatively slow integrating compensator is used. This is realized by connecting a relatively large valued capacitor C3 at pin 14. The capacitor C3 also filters out the higher frequency components associated with the signal $V_O$ in the error signal $V_E=(V_{REF}-V_O)$, which accomplishes the same result that would be achieved by lowpass filtering the voltage signal $V_O$ before it is applied to pin 9. A typical capacitance value of 2 $\mu F$ for C3 has been found to provide adequate filtering to detect, and essentially pass only the average component of the voltage $V_O$ contained within the error voltage.

Figure 6:
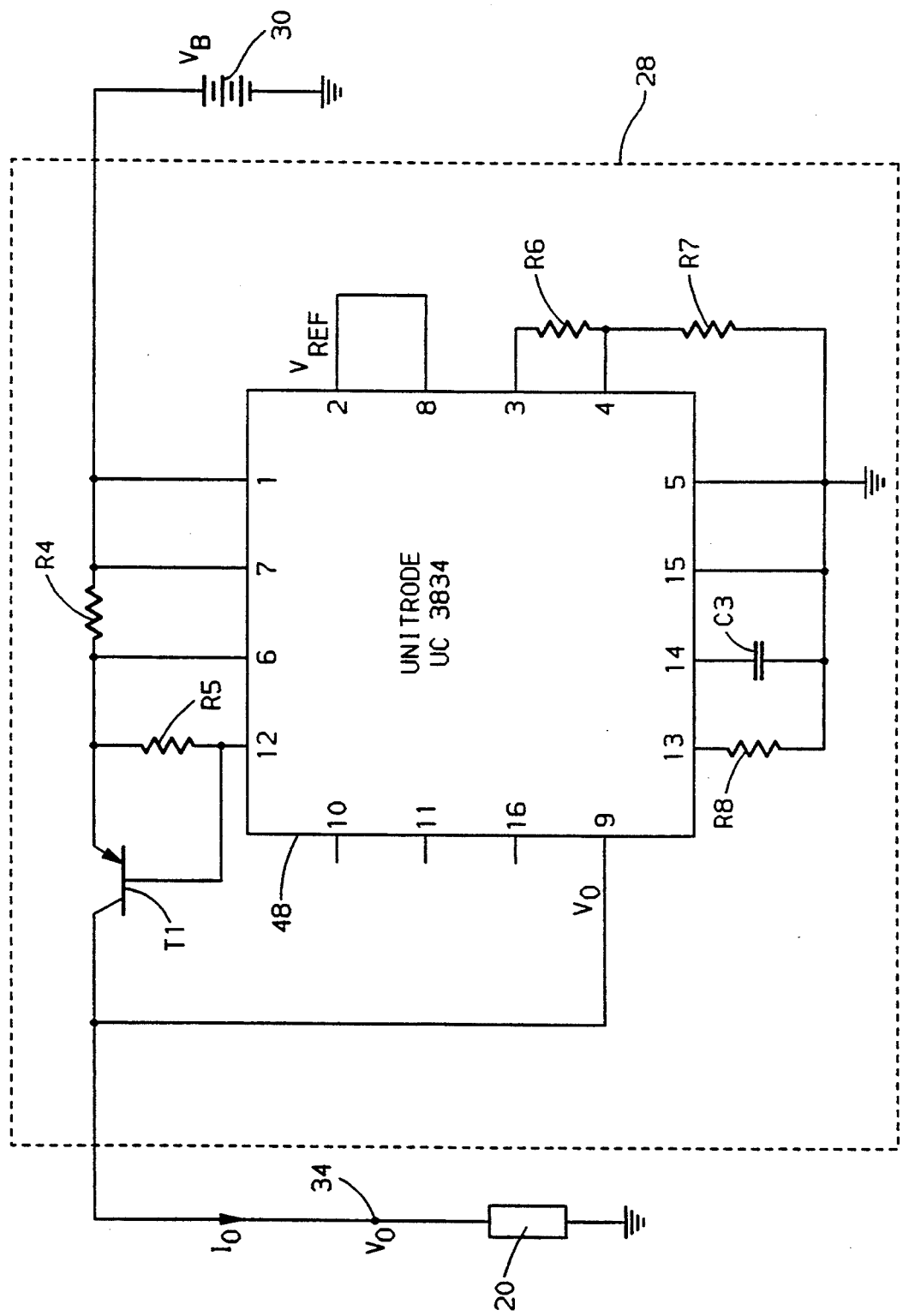
FIG. 6 illustrates circuitry for implementing a second embodiment for the controlled excitation source shown in FIG. 1, and functionally represented by the block diagram of FIG. 4, where the average voltage detected across the MR device is employed for regulating the delivered current.

The implementation for the second embodiment shown in FIG. 6 differs from that of the first embodiment shown in FIG. 5 in one additional aspect. In the first embodiment, a voltage divider comprising resistors R1 and R2 was used to determined the value of the reference voltage $V_{REF}$ applied to pin 8 of UC3834. In the second embodiment of FIG. 6, pin 8 is connected directly to pin 2, which sets the reference voltage $V_{REF}$ equal to the voltage $V_B$−2.0 or 10.0 volts, if the battery 30 provides a voltage potential of 12.0 volts. As a result, the second embodiment maintains the average value of the voltage $V_O$ at the reference average voltage of $V_{REF}$=10.0 volts. Since the largest peak-to-peak swing in the voltage $V_O$ is approximately 2.0 volts for the expected operating temperature range (see FIG. 9), setting $V_{REF}$ to 10.0 volts ensures that a voltage drop of at least one volt can occur across the controlled excitation source 28, which, as discussed previously, is required for its proper operation.

The first and second embodiments require the same value for $I_{OMAX}$, so the same resistance values are used for resistor R4, R5, R6, and R7 in both embodiments.

The behavior illustrated in FIGS. 7, 8, and 9 applies to both of the above described embodiments, and as a consequence, the second embodiment, which requires fewer components, provides the same advantages that have previously been attributed to the first embodiment. The two embodiments function in essentially the same fashion, except for differences that occur during initial operation and in slow speed sensing applications. The first embodiment of the invention requires that the peak value of $V_0$ be detected during the initial operation of MR device 20 before the variations in the voltage drop $V_0$ are related to changes in the sensed magnetic field. The second embodiment of the invention requires that the frequency of variation in $V_O$ caused by changes in the sensed magnetic field exceed a minimal frequency before the variations in the voltage drop $V_O$ are related to changes in sensed magnetic field. This minimal frequency is essentially cutoff frequency of the lowpass filter used to detect the average value of $V_O$.

The aforementioned description of the preferred embodiments of the invention are for the purpose of illustrating the invention, and are not to be considered as limiting or restricting the invention, since many modifications may be made by the exercise of skill in the art without departing from the scope of the invention.

The embodiments of the invention in which an exclusive property or privilege is claimed are defined as follows:

1. An apparatus for electrically exciting a magneto-resistor device employed to sense changes in a magnetic field, the magneto-resistor device having a resistance that varies sinusoidally in accordance with changes in the sensed magnetic field, the apparatus comprising:
   means for delivering an electric current to flow through the magneto-resistor device to produce a sinusoidally varying voltage drop across the resistance of the magneto-resistor device;
   means for limiting the electric current flowing through the resistance of the magneto-resistor device to a predetermined maximum current value;
   means for detecting a predetermined characteristic of the sinusoidally varying voltage drop appearing across the resistance of the magneto-resistor device; and
   means for controlling the current flowing through the resistance of the magneto-resistor device to maintain the detected characteristic at a desired value, when the current flowing through the resistance of the magneto-resistor device is less than the predetermined maximum current value.

2. An apparatus for electrically exciting a magneto-resistor device employed to sense changes in a magnetic field, the magneto-resistor device having a resistance that sinusoidally varies in accordance with changes in the sensed magnetic field, the apparatus comprising:
   means for delivering an electric current to flow through the magneto-resistor device to produce a sinusoidally varying voltage drop across the resistance of the magneto-resistor device;
   means for limiting the electric current flowing through the resistance of the magneto-resistor device to a predetermined maximum current value;
   means for detecting an average voltage for the sinusoidally varying voltage drop appearing across the resistance of the magneto-resistor device; and
   means for controlling the current flowing through the resistance of the magneto-resistor device to maintain the detected average voltage at a desired average value, when the current flowing through the resistance of the magneto-resistor device is less than the predetermined maximum current value.

3. An apparatus tier electrically exciting a magneto-resistor device employed to sense changes in a magnetic field, the magneto-resistor device having a resistance that sinusoidally varies in accordance with changes in the sensed magnetic field, the apparatus comprising:
   means for delivering an electric current to flow through the magneto-resistor device to produce a sinusoidally varying voltage drop across the resistance of the magneto-resistor device;
   means for limiting the electric current flowing through the resistance of the magneto-resistor device to a predetermined maximum current value;
   means for detecting a peak voltage for the sinusoidally varying voltage drop appearing across the resistance of the magneto-resistor device; and
   means for controlling the current flowing through the resistance of the magneto-resistor device to maintain the detected peak voltage at a desired peak value, when the current flowing through the resistance of the magneto-resistor device is less than the predetermined maximum current value.

4. A method for electrically exciting a magneto-resistor device employed to sense changes in a magnetic field, the magneto-resistor device having a resistance that sinusoidally varies in accordance with changes in the sensed magnetic field, the steps for the method comprising:
   delivering an electric current to flow through the magneto-resistor device to produce a sinusoidally varying voltage drop across the resistance of the magneto-resistor device;
   limiting the electric current flowing through the resistance of the magneto-resistor device to a predetermined maximum current value;
   detecting a predetermined characteristic of the sinusoidally varying voltage drop appearing across the resistance of the magneto-resistor device; and
   controlling the current flowing through the resistance of the magneto-resistor device to maintain the detected characteristic at a desired value, when the current flowing through the resistance of the magneto-resistor device is less than the predetermined maximum current value.

5. A method for electrically exciting a magneto-resistor device employed to sense changes in a magnetic field, the magneto-resistor device having a resistance that sinusoidally varies in accordance with changes in the sensed magnetic field, the steps of the method comprising:

delivering an electric current to flow through the magneto-resistor device to produce a sinusoidally varying voltage drop across the resistance of the magneto-resistor device;

limiting the electric current flowing through the resistance of the magneto-resistor device to a predetermined maximum current value;

detecting an average voltage for the sinusoidally varying voltage drop appearing across the resistance of the magneto-resistor device; and controlling the current flowing through the resistance of the magneto-resistor device to maintain the detected average voltage at a desired average value, when the current flowing through the resistance of the magneto-resistor device is less than the predetermined maximum current value.

6. A method for electrically exciting a magneto-resistor device employed to sense changes in a magnetic field, the magneto-resistor device having a resistance that sinusoidally varies in accordance with changes in the sensed magnetic field, the steps of the method comprising:

delivering an electric current to flow through the magneto-resistor device to produce a sinusoidally varying voltage drop across the resistance of the magneto-resistor device;

limiting the electric current flowing through the resistance of the magneto-resistor device to a predetermined maximum current value;

detecting a peak voltage for the sinusoidally varying voltage drop appearing across the resistance of the magneto-resistor device; and controlling the current flowing through the resistance of the magneto-resistor device to maintain the detected peak voltage at a desired peak value, when the current flowing through the resistance of the magneto-resistor device is less than the predetermined maximum current value.

* * * * *